United States Patent [19]

Ganguly et al.

[11] 3,743,953

[45] July 3, 1973

[54] SURFACE WAVE ACOUSTIC PARAMETRIC AMPLIFIER

[75] Inventors: Achintya K. Ganguly, Whitestone, N.Y.; Stanley Zemon, Boston; Joseph Zucker, Waltham, both of Mass.

[73] Assignee: GTE Laboratories Incorporated, Waltham, Mass.

[22] Filed: June 10, 1971

[21] Appl. No.: 151,652

[52] U.S. Cl. .................................. 330/4.6, 330/5.5

[51] Int. Cl. .................................. H03f 7/00

[58] Field of Search .................................. 330/5.5, 4.6

[56] References Cited

UNITED STATES PATENTS

| | | | |
|---|---|---|---|
| 3,568,079 | 3/1971 | Yoder | 330/5.5 |
| 3,634,774 | 1/1972 | Carr | 330/5.5 |
| 3,633,118 | 1/1972 | Means et al. | 330/5.5 |

OTHER PUBLICATIONS

Tseng, "IBM Technical Disclosure Bulletin," March 1970, p. 1699–1700.

*Primary Examiner*—Roy Lake
*Assistant Examiner*—Darwin R. Hostetter
*Attorney*—Irving M. Kriegsman

[57] ABSTRACT

An acoustic surface wave parametric amplifier has an input interdigital pump transducer and an input interdigital signal transducer formed on the surface of a piezoelectric material. A source of ac power is coupled to each transducer with the frequency of the source coupled to the signal transducer being lower than the frequency of the source coupled to the pump transducer. The ac source supplied to each of the input transducers creates an electric field in the piezoelectric material which is converted into an acoustic surface wave which propagates on the surface of the piezoelectric material. Preferably, the input transducers are oriented at an angle to one another so that the signal acoustic wave and the pump acoustic wave propagate at an angle to one another causing phase matching between the signal and pump waves. Interaction between the pump and signal waves causes amplification of the signal wave which is detected by an output interdigital transducer oriented parallel to and opposite the signal transducer. A dc voltage source may also be supplied between the signal transducer and the output transducer to compensate for the losses caused by the free carriers of the piezoelectric material.

3 Claims, 2 Drawing Figures

INVENTORS.
Achintya K. Ganguly
Stanley Zemon
Joseph Zucker
BY
ATTORNEY

SURFACE WAVE ACOUSTIC PARAMETRIC AMPLIFIER

BACKGROUND OF THE INVENTION

The invention relates to acoustic wave amplifiers and in particular to acoustic surface wave amplifiers.

In recent times, considerable work has been done on acoustic wave devices. These devices have been found to be particularly useful as filters and delay lines. To compensate for the transduction losses and attenuation in the propagating medium, an acoustic wave amplifier is required.

One class of acoustic wave amplifiers utilizes an acoustic wave which travels through the bulk of a piezoelectric material. In these devices, transducers are fixed to opposite ends of the piezoelectric material. A source of ac power is impressed across one of the transducers to create an acoustic wave which is transmitted through the bulk of the material. A dc electric field impressed across the piezoelectric material causes carriers to drift faster than the velocity of the acoustic wave through the piezoelectric material. Interaction between the acoustic wave and the drifting carriers causes amplification of the acoustic wave.

Another device for amplification of bulk acoustic waves utilizing a parametric effect has been reported. In that device, a photoconductive piezoelectric material is placed in a coaxial reentrant cavity and excited by an appropriate source of light. An ac pump signal coupled to a transducer on the end of the piezoelectric material creates an acoustic wave which is transmitted through the bulk of the material and a dc voltage applied across the material causes drifting of the carriers through the material. Using this arrangement, amplification of a signal at a frequency equal to one half the pump signal frequency has been observed. While amplification of acoustic waves has been obtained in bulk wave devices, these devices have the disadvantage of being incompatible with integrated circuit technology and have relatively poor transducer efficiency.

A second class of acoustic wave devices is surface wave acoustic amplifiers. In these amplifiers a pair of transducers is coupled to the surface of a piezoelectric material. A source of ac power applied to one of the transducers creates an acoustic wave which propagates along the surface of the material within approximately an acoustic wavelength of the surface. A dc electric field of appropriate magnitude is applied between the transducers causing carriers in the material to drift in the propagation direction of the surface waves. Interaction between the drifting carriers and the surface acoustic wave causes amplification of the wave.

This invention is directed to an acoustic surface wave amplifier which utilizes parametric coupling to amplify an acoustic surface wave.

SUMMARY OF THE INVENTION

The invention relates to a device which utilizes the nonlinear acousto-electric properties of piezoelectric semiconductor materials to produce parametric coupling between acoustic surface waves of different frequencies propagating on the surface of the material.

The acoustic parametric amplifier comprises a piezoelectric body of material capable of sustaining traveling acoustic surface waves. A first transducer means coupled to the piezoelectric body converts electrical power at a first frequency into a surface wave propagating on the piezoelectric body. A second transducer means coupled to the piezoelectric body in spaced apart relationship from the first transducer means converts electrical power at a second frequency which is higher than the first frequency into a surface wave which also propagates on the surface of the piezoelectric body. The first and second surface waves interact to cause amplification of the first surface wave.

In the preferred embodiment of the invention, the first and second transducers are oriented at an angle to one another so that phase matching occurs between the first and second surface waves. In addition, means for applying a dc electric field to the piezoelectric body are coupled to the piezoelectric material.

DESCRIPTION OF THE PREFERRED EMBODIMENT

Figure 1:
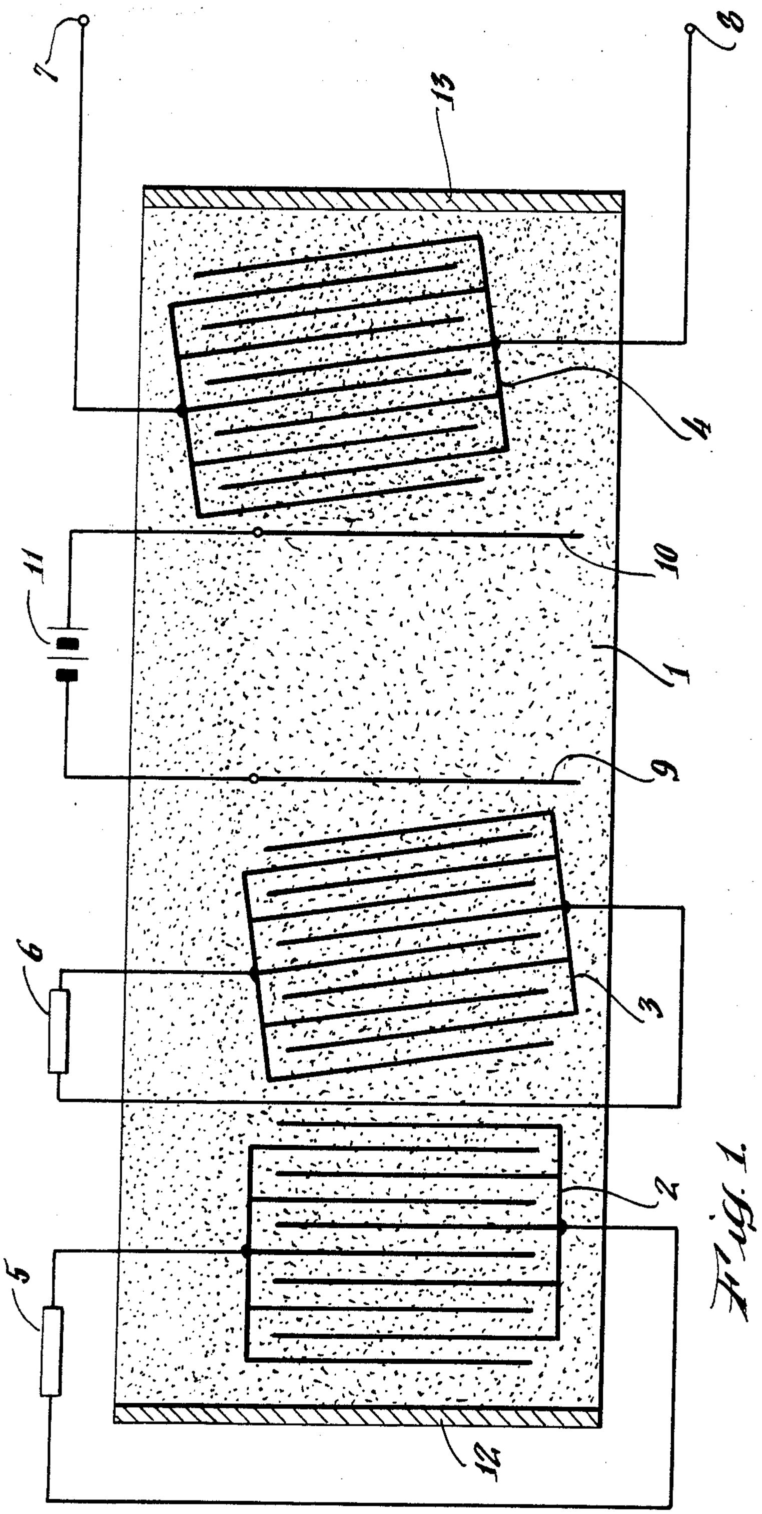
FIG. 1 illustrates an acoustic parametric amplifier constructed in accordance with the principles of the invention.

FIG. 1 shows a substrate 1 which may be made of piezoelectric semiconducting materials such as a crystal of a II–VI compound of crystal class 6mm, such as cadmium sulfide, CdS, zinc oxide, ZnO, cadmium selenide, CdSe, zinc sulfide, ZnS (wurtzite), zinc selenide, ZnSe, or zinc telluride, ZnTe, or cadmium telluride, CdTe, or a III-V compound, such as gallium arsenide, GaAs, gallium antimonide, GaSb, indium antimonide, InSb, gallium phosphide, GaP, indium arsenide, InAs, or indium phosphide, InP. Alternatively, an oriented or single crystal thin film more than 10 wavelengths thick of any of the above listed piezoelectric materials may be deposited on a non-piezoelectric substrate such as glass or fused quartz.

Input pump transducer 2, input signal transducer 3 and output transducer 4 are each formed on the surface of substrate 1. Each transducer has two combs having a plurality of parallel interdigital fingers constructed of a thin layer of conductive material such as gold, aluminum, silver or indium which is deposited, bonded or otherwise formed on the surface of substrate 1 by conventional techniques. The spacing between adjacent fingers is determined from the formula $f\lambda = v$ where $f$ equals the frequency of the signal for which it is desired to achieve maximum response in the transducer; $v$ equals the phase velocity of the surface wave corresponding to the acoustic frequency and $\lambda$ equals twice the spacing between the centers of adjacent fingers.

Coupled across the fingers of transducer 2 is an ac power source 5, hereinafter referred to as the pump source, having a frequency $f_p$. A second source of ac power 6, hereinafter referred to as the signal source, having a frequency $f_s$, is coupled across the fingers of transducer 3. The frequencies of the pump and signal sources are chosen so that $f_p$ is greater than $f_s$.

When ac power from pump source 5 is applied to pump transducer 2 adjacent fingers of pump transducer 2 become oppositely charged and an electric field is established between the fingers of the transducer. Inasmuch as a piezoelectric material is one in which strain and stress is induced inside the material by application of an external electric field, strain is induced in the piezoelectric material. Strain so induced causes the propagation or travel of a strain wave, termed an acoustic surface wave, along the surface of the material in a direction perpendicular to the direction of orientation of the fingers of transducer 2. In turn, the acoustic surface wave travelling along the surface of the piezoelectric materials generates an electric field in the material which travels through the crystal with a velocity equal to the velocity of the acoustic wave. This electric field causes a bunching of the space charge in the crystal. In a similar manner, signal source 6 applied to signal transducer 3 causes an acoustic surface wave having signal frequency $f_s$ to propagate along substrate 1 which in turn generates an electric field also causing bunching of space charge. Interaction of the electric field associated with the signal acoustic surface wave and the bunched space charge associated with the pump acoustic wave causes generation of an idler wave which is coupled to the signal wave and provides parametric amplification of the signal wave.

The amplified acoustic signal wave passes output transducer 4 causing a strain in the piezoelectric material between adjacent fingers in the transducer. Because of the properties of the piezoelectric material, the strain causes a potential difference or voltage to appear across adjacent fingers of the transducer. The amplified acoustic signal wave is thus converted into an electrical signal with a frequency equal to $f_s$ which appears across output transducer terminals 7 and 8.

Parametric interaction is optimum when there is phase matching between the pump, signal and idler waves which occurs when the pump and signal waves are propagated at an angle to one another. Therefore, as shown in FIG. 1, transducer 3 is preferably oriented at an angle to transducer 2. Since transducer 4 detects the amplified signal wave, it is oriented with its fingers parallel to the fingers of transducer 3.

Figure 2:
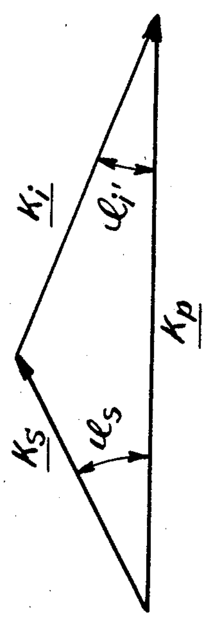
FIG. 2 is a vector diagram included to aid in the explanation of the operation of the invention.

The equation for the conservation of energy which governs parametric amplification is $\omega_p = \omega_s + \omega_i$ where $\omega_p$ is the frequency of the pump wave, $\omega_s$ is the frequency of the signal wave and $\omega_i$ is the frequency of the idler wave. The pump frequency for active coupling is thus the sum of the idler and signal frequencies. Phase matching occurs when the conservation of momentum relationship is also met. Referring to FIG. 2, there is shown a vector diagram illustrating the relationship between the pump, signal and idler wave vectors for the phase matching condition; with $\underline{K_p}$, $\underline{K_s}$, and $\underline{K_i}$ representing the wave vectors of the pump, signal and idler waves respectively. $\phi_s$ is the angle between the pump and signal wave vectors and $\phi_i$ is the angle between the pump and idler wave vectors. Thus, for the phase matching condition to occur, $\underline{K_p} = \underline{K_s} + \underline{K_i}$.

By applying the principles of conservation of energy and momentum, the following expressions are obtained for the phase matching angles:

$$\cos \varphi_s = \frac{\left[\left(\frac{\omega_p}{v_p}\right)^2 + \left(\frac{\omega_s}{v_s}\right)^2 - \left(\frac{\omega_i}{v_i}\right)^2\right]}{\left[2\left(\frac{\omega_p \omega_s}{v_p v_s}\right)\right]} \qquad 1(a)$$

$$\cos \varphi_i = \frac{\left[\left(\frac{\omega_p}{v_p}\right)^2 + \left(\frac{\omega_i}{v_i}\right)^2 - \left(\frac{\omega_s}{v_s}\right)^2\right]}{\left[2\left(\frac{\omega_p \omega_i}{v_p v_i}\right)\right]} \qquad 1(b)$$

where $v_p$, $v_s$ and $v_i$ represent respectively the acoustic velocity of the pump, signal and idler waves in the piezoelectric material.

The velocity of the surface acoustic waves is computed by solving a system of piezoelectric equations in conjunction with appropriate boundary conditions. In a semiconducting or photoconducting piezoelectric material, the coupled electrical and mechanical equations are as follows:

Stress equation of motion: $\rho\ (\sigma^2{}_0\ \underline{u}/\sigma\ t^2) = \Delta \cdot \underline{\underline{T}}$ (2)

Piezoelectric equation of state:

$$\underline{\underline{T}} = \underline{\underline{\underline{c}}} \cdot \underline{\underline{S}} - \underline{\underline{\underline{e}}} \cdot \underline{E}_1 \qquad (3)$$

$$\underline{D}_1 = \underline{\underline{\underline{e}}} \cdot \underline{\underline{S}} + \underline{\underline{\epsilon}} \cdot \underline{E}_1 \qquad (4)$$

Poisson's equation:

$$\nabla \cdot \underline{D}_1 = -q\ (n - n_o) \qquad (5)$$

Equation of current continuity:

$$\nabla \cdot \underline{j} - q\ \sigma\ n/\sigma\ t = 0 \qquad (6)$$

Equation for current density:

$$\underline{j} = n_o q \mu \underline{E}_o + n_o\ q\ \mu\ \underline{E}_s + n_s\ q\ \mu\ \underline{E}_o + n_s\ q\ \mu\ \underline{E}_s + q\nabla n \qquad (7)$$

where $\underline{u}$, $\underline{T}$, $\underline{S}$ are respectively mechanical displacement vector, stress tensor and strain tensor; $\underline{E}_1$, $D_1$ and $\underline{j}$ are respectively electric field, electric displacement and current density. The relationship $\underline{E}_1 = \underline{E}_o + \underline{E}_s$, where $\underline{E}_o$ is the applied dc voltage and $\underline{E}_s$ is the field associated with the acoustic waves is known. $\underline{\underline{\underline{c}}}$, $\underline{\underline{e}}$ and $\underline{\underline{\epsilon}}$ are the elastic, piezoelectric and dielectric tensors respectively; $D$, $q$ and $\mu$ are respectively the diffusion constant, charge and mobility of the electrons and $\rho$ equals the density of the material. The electron density is given by the equation $n = n_o + n_s$ where $n_o$ is the average electron density and $n_s$ is the bunching produced by acoustic waves. The drift velocity of the carriers, $\underline{v}_d$, is given by the equation $\underline{v}_d = \mu \underline{E}_o$.

Outside of the substrate, the electrical equations are:

$$\Delta \cdot \underline{D}_2 = 0 \qquad (8)$$

$$\underline{D}_2 = \epsilon_o\ \underline{E}_2 \qquad (9)$$

where $\epsilon_o$ is the dielectric constant in a vacuum and $\underline{D}_2$ and $\underline{E}_2$ are, respectively, the electric displacement and electric field outside the substrate.

The boundary conditions are as follows:

a. at the free surface normal components of $\underline{\underline{T}} = 0$ (10)

tangential components of $\underline{\underline{T}} = 0$ (11)

normal component of $\underline{D}_1$ = normal component of $\underline{D}_2$ (12)

tangential components of $\underline{E}_1$ = tangential components of $\underline{E}_2$ (13)

normal component of $\underline{j} = 0$ (14)

b. at an infinite distance from the surface $\underline{u}$, $\underline{E}_s$, $\underline{E}_2$ and $n_s = 0$ (15)

In equation (7) $n_s q \mu \underline{E}_s$ is the nonlinear term which gives rise to parametric amplification. By using linear approximation, this term which is small compared to the other terms for small amplitude waves may be neglected in computing the velocity of sound. Once the linear problem has been solved, the nonlinear term can be treated by a perturbation technique to calculate parametric gain. A perturbation technique for solving this equation is outlined in the publication titled "Theory of Parametric Amplification of Surface Waves" by A. K. Ganguly, published in 8 Solid State Communications 738 (1970).

The linear velocity of the acoustic wave may be obtained by solving equations (2) – (15) using an appropriately programmed general purpose computer. A technique for solving these equations is described in a publication by C. C. Tseng and R. M. White, titled "Propagation of Piezoelectric and Elastic Surface Waves on the Basal Plane of Hexagonal Piezoelectric Crystal," which appeared at 38 Journal of Applied Physics 4274 (1967).

When $v_d$ is not equal to the acoustic velocity, the wave vector $\underline{K}$ is complex and the acoustic velocity, $v$, is then given by the equation: $v = \omega/(\text{real part of } \underline{K})$. The imaginary part of $\underline{K}$ gives linear gain (or loss). Gain occurs when $v_d > v$ and loss occurs when $v_d < v$. With a dc electric field applied to the piezoelectric field the velocity of the sound waves depends upon the component of drift velocities of the carriers in the direction of wave propagation. Thus, in equations 1($a$) and 1($b$) the angles $\phi_s$ and $\phi_i$ will occur on the right hand side through $v_s$ and $v_i$. $\phi_s$ and $\phi_i$ are computed on an appropriately programmed general purpose computer in a self-consistent way by the following steps:

I. Compute $v_p$, $v_s$ and $v_i$ from equations (2) – (15) using $\phi_s$ and $\phi_i$ equal to 0.

II. Use the current values of $v_p$, $v_s$ and $v_i$ as in equations 1($a$) and 1($b$) to calculate new values for $\phi_s$ and $\phi_i$.

III. Using the values of $\phi_s$ and $\phi_i$ obtained in (II), recalculate $v_p$, $v_s$ and $v_i$.

IV. Repeat operations (II) and (III) until the difference between the values of $\phi_s$ (as well as $\phi_i$) in two successive steps are less than a preassigned small number, for example $10^{-10}$. The values of $\phi_s$ thus obtained assures phase matching of the signal and pump waves and provides optimum parametric amplification.

One of the sources of loss in an acoustic amplifier is the interaction of the acoustic surface wave with the free carriers in the piezoelectric material. This loss can be substantially eliminated by causing the free carriers to drift in the piezoelectric material with a velocity component in the desired direction of surface wave propagation substantially equal to that of the acoustic surface wave.

This result may be achieved by using the additional apparatus shown in FIG. 1. Two thin conductor strips 9 and 10 are bonded by conventional techniques to the surface of substrate 1 between transducers 3 and 4. A source of dc voltage 11 is coupled between electrodes 9 and 10 with a polarity selected to cause the carriers in substrate 1 to drift toward the outward transducer 4 and a magnitude selected to cause the drift velocity of the carriers to be substantially equal to the surface wave velocity. The magnitude of the applied dc voltage can be determined by the following formula:

$$V_{dc} = L(v_s/\mu\cos\phi_s)$$

where $$V_{dc} = \text{applied dc voltage}$$

and $$L = \text{distance between the two electrodes.}$$

The value of the dc voltage may also be determined experimentally particularly for a photoconducting piezoelectric material with a high ratio of light to dark conductivity for signal frequencies below which lattice attenuation becomes important. It is known that in the absence of an applied dc field of the proper potential, the free carriers in the substrate will cause attenuation of the surface wave propagating on the material. Signal source 6 of known magnitude is applied across the fingers of transducer 3 thereby generating an acoustic surface wave on the piezoelectric material. The output voltage across the fingers of output transducer 4 is measured. The surface of the piezoelectric material is then illuminated by an appropriate light source thereby creating carriers in the material and the dc voltage 11 is varied until the magnitude of the output voltage across the fingers of output transducer 4 with the surface of the piezoelectric material illuminated equals the magnitude of the output voltage without illumination. Under these conditions, there is no appreciable attenuation in the piezoelectric material and the drift velocity of the carriers in the material substantially equals the surface velocity. The desired magnitude of the dc voltage is thus established.

Referring again to FIG. 1 there is also preferably formed on substrate 1, acoustic surface wave absorbers 12 and 13 on opposite ends thereof. These absorbers may be strips of wax or lead formed on the substrate by conventional techniques. The surface wave absorbers prevent unwanted reflections from the ends of the substrate.

An example of an acoustic parametric amplifier having the configurations shown in FIG. 1 utilized photoconducting CdS. The frequency of the pump source equalled 84 MHz and the frequency of the signal source equalled 42 MHz. The pump transducer was constructed from indium and had 80 pairs of fingers. The space between the centers of adjacent fingers was 0.4 mil. The signal and output transducers were also constructed from indium, had 40 pairs of fingers and 0.8 mil spacing between adjacent fingers. The signal and output transducers were oriented at an angle of 3° with respect to the pump transducer. A dc voltage of 770 volts was applied between electrodes which were spaced 280 mils apart.

We have found that the net gain is maximum and the threshold pump strain (necessary for net gain when the drift velocity of the carriers is less than the sound velocity) is minimum when the signal frequency is equal to one-half the pump frequency.

What is claimed is:

1. An acoustic surface wave parametric amplifier comprising:

a. a piezoelectric semiconducting body;

b. a signal transducer comprising a pair of interdigital fingers formed on the surface of said piezoelectric body for converting electrical signals of the first frequency to a surface wave propagating on said body;

c. a pump transducer comprising a pair of interdigital fingers formed on the surface of said piezoelectric body in spaced apart relationship from said signal transducer for converting electrical signals at a second frequency higher than said first frequency into a pump surface wave propagating on said body, said pump and signal transducers being oriented on the surface of the piezoelectric body such than an angle $\phi_s$ is formed between the direction of propagation of the pump and signal acoustic surface waves, said angle $\phi_s$ being selected so as to provide phase matching between the pump and signal acoustic waves, and said angle being defined by the formula $$\cos \varphi_s = \frac{\left[\left(\frac{\omega_p}{v_p}\right)^2 + \left(\frac{\omega_s}{v_s}\right)^2 - \left(\frac{\omega_i}{v_i}\right)^2\right]}{\left[2\left(\frac{\omega_p \omega_i}{v_p v_i}\right)\right]}$$

where $\phi_s$ is the angle between pump and signal transducers, $\omega_p$ is the frequency of the pump wave, $\omega_s$ is the frequency of the signal wave, $\omega_i$ is the frequency of the idler wave, $v_p$ represents the acoustic velocity of the pump wave, $v_s$ represents the acoustic velocity of the signal wave, and $v_i$ represents the acoustic velocity of the idler wave in the piezoelectric semiconducting body; and d. an output transducer comprising a pair of interdigital fingers formed on the surface of said piezoelectric body in spaced apart relationship from said pump and signal transducers, said output transducer being arranged to detect the signal acoustic wave and provide an output signal proportional to the magnitude thereof.

2. The amplifier of claim 1 further comprising means for applying a dc potential coupled to the surface of said piezoelectric body between the signal transducer and said output transducer.

3. The amplifier of claim 2 wherein the magnitude of said dc voltage is chosen to cause the component of the drift velocity of the free carriers parallel to the propagation direction of the signal acoustic surface wave to be equal to the velocity of the acoustic surface wave.

* * * * *

PO-1050
(5/69)
-679

UNITED STATES PATENT OFFICE
CERTIFICATE OF CORRECTION

Patent No. 3,743,953 Dated July 3, 1973

Inventor(s) ACHINTYA K. GANGULY, STANLEY ZEMON, JOSEPH ZUCKER

It is certified that error appears in the above-identified patent and that said Letters Patent are hereby corrected as shown below:

Column 4, line 10, change the equation from

"$p(\sigma^2 0\, \underline{u}/\sigma t^2) = \Delta \cdot \underline{\underline{T}}$" to --$p(\partial^2 \underline{u}/\partial t^2) = \nabla \cdot \underline{\underline{T}}$--.

Column 4, line 25, change the equation from

. "$\nabla \cdot \underline{j} - q\, \sigma\, n/\sigma\, t = 0$" to --$\nabla \cdot \underline{j} - q\, \partial\, n/\partial\, t = 0$--.

Column 4, line 29, change the equation from

"$\underline{j} = n_o q \mu \underline{E}_o + n_o\, q\, \mu\, \underline{E}_s + n_s\, q\, \mu\, \underline{E}_o + n_s\, q\, \mu\, \underline{E}_s + q\nabla n$" to --$\underline{j} = n_o q \mu \underline{E}_o + n_o\, q\, \mu\, \underline{E}_s + n_s\, q\, \mu\, \underline{E}_o + n_s\, q\, \mu\, \underline{E}_s + qD\nabla n$--.

Column 4, line 48, change the equation from

"$\Delta \cdot \underline{D}_2 = 0$" to --$\nabla \cdot \underline{D}_2 = 0$--.

Signed and sealed this 19th day of February 1974.

(SEAL)
Attest:

EDWARD M. FLETCHER, JR.
Attesting Officer

C. MARSHALL DANN
Commissioner of Patents